United States Patent
Takezawa et al.

(10) Patent No.: US 11,486,043 B2
(45) Date of Patent: Nov. 1, 2022

(54) METAL CONTAMINATION PREVENTION METHOD AND APPARATUS, AND SUBSTRATE PROCESSING METHOD USING THE SAME AND APPARATUS THEREFOR

(71) Applicant: TOKYO ELECTRON LIMITED, Tokyo (JP)

(72) Inventors: Yoshihiro Takezawa, Nirasaki (JP); Shigeru Nakajima, Nirasaki (JP); Katsushige Harada, Nirasaki (JP); Yusuke Tachino, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 607 days.

(21) Appl. No.: 16/526,088

(22) Filed: Jul. 30, 2019

(65) Prior Publication Data
US 2020/0040463 A1 Feb. 6, 2020

(30) Foreign Application Priority Data

Aug. 3, 2018 (JP) .............................. JP2018-146996

(51) Int. Cl.
| | | |
|---|---|---|
| *C23F 4/02* | (2006.01) | |
| *C23C 8/80* | (2006.01) | |
| *C23C 8/06* | (2006.01) | |

(52) U.S. Cl.
CPC ................... *C23F 4/02* (2013.01); *C23C 8/06* (2013.01); *C23C 8/80* (2013.01)

(58) Field of Classification Search
CPC ......... C23C 8/06; C23C 8/80; C23C 16/4404; C23F 4/02
See application file for complete search history.

(56) References Cited

FOREIGN PATENT DOCUMENTS

| | | |
|---|---|---|
| JP | 2017-155314 A | 9/2017 |
| KR | 1020170095880 A | 8/2017 |
| KR | 1020170103656 A | 9/2017 |

*Primary Examiner* — Jessee R Roe
(74) *Attorney, Agent, or Firm* — Nath, Goldberg & Meyer; Jerald L. Meyer; Tanya E. Harkins

(57) ABSTRACT

There is provided a metal contamination prevention method performed by passing a metal chloride gas through a metal component having a surface covered with an inactive film formed of a chromium oxide, the method including: generating a chromium chloride (III) hexahydrate by supplying a hydrochloric acid to the inactive film covering the surface of the metal component and allowing the chromium oxide to react with the hydrochloric acid; removing a chromium from the inactive film by evaporating the chromium chloride (III) hexahydrate; and covering a surface of the inactive film with a compound containing a metal contained in the metal chloride gas.

14 Claims, 6 Drawing Sheets

METAL CONTAMINATION PREVENTION METHOD AND APPARATUS, AND SUBSTRATE PROCESSING METHOD USING THE SAME AND APPARATUS THEREFOR

CROSS-REFERENCE TO RELATED APPLICATION

This application is based upon and claims the benefit of priority from Japanese Patent Application No. 2018-146996, filed on Aug. 3, 2018, the entire contents of which are incorporated herein by reference.

TECHNICAL FIELD

The present disclosure relates to a metal contamination prevention method and a metal contamination prevention apparatus, and a substrate processing method using the same and a substrate processing apparatus therefor.

BACKGROUND

In the related art, there is known a metal prevention method which is performed before using a metal component whose surface is covered with an inactive film made of a chromium oxide (see, for example, Patent Document 1). The metal contamination prevention method disclosed in Patent Document 1 includes supplying a nitric acid to the inactive film covering the surface of the metal component, allowing the nitric acid to react with a chromium oxide to generate a chromium nitrate, and evaporating the generated chromium nitrate to remove the chromium from the inactive film.

PRIOR ART DOCUMENT

Patent Documents

Patent Document 1: Japanese Laid-Open Patent Publication No. 2017-155314

SUMMARY

The present disclosure provides a metal contamination prevention method and a metal contamination prevention apparatus, which are capable of removing chromium from an inactive film made of a chromium oxide and covering a surface of the inactive film with a metal compound containing the same kind of metal as a metal chloride gas, before or while passing the metal chloride gas through the metal component whose surface is covered with the inactive film, thereby suppressing the chromium from diffusing, and a substrate processing method using the metal contamination prevention method and apparatus, and a substrate processing apparatus therefor.

According to one embodiment of the present disclosure, there is provided a metal contamination prevention method performed by passing a metal chloride gas through a metal component having a surface covered with an inactive film formed of a chromium oxide, the method including: generating a chromium chloride (III) hexahydrate by supplying a hydrochloric acid to the inactive film covering the surface of the metal component and allowing the chromium oxide to react with the hydrochloric acid; removing a chromium from the inactive film by evaporating the chromium chloride (III) hexahydrate; and covering a surface of the inactive film with a compound containing a metal contained in the metal chloride gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of the present disclosure will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
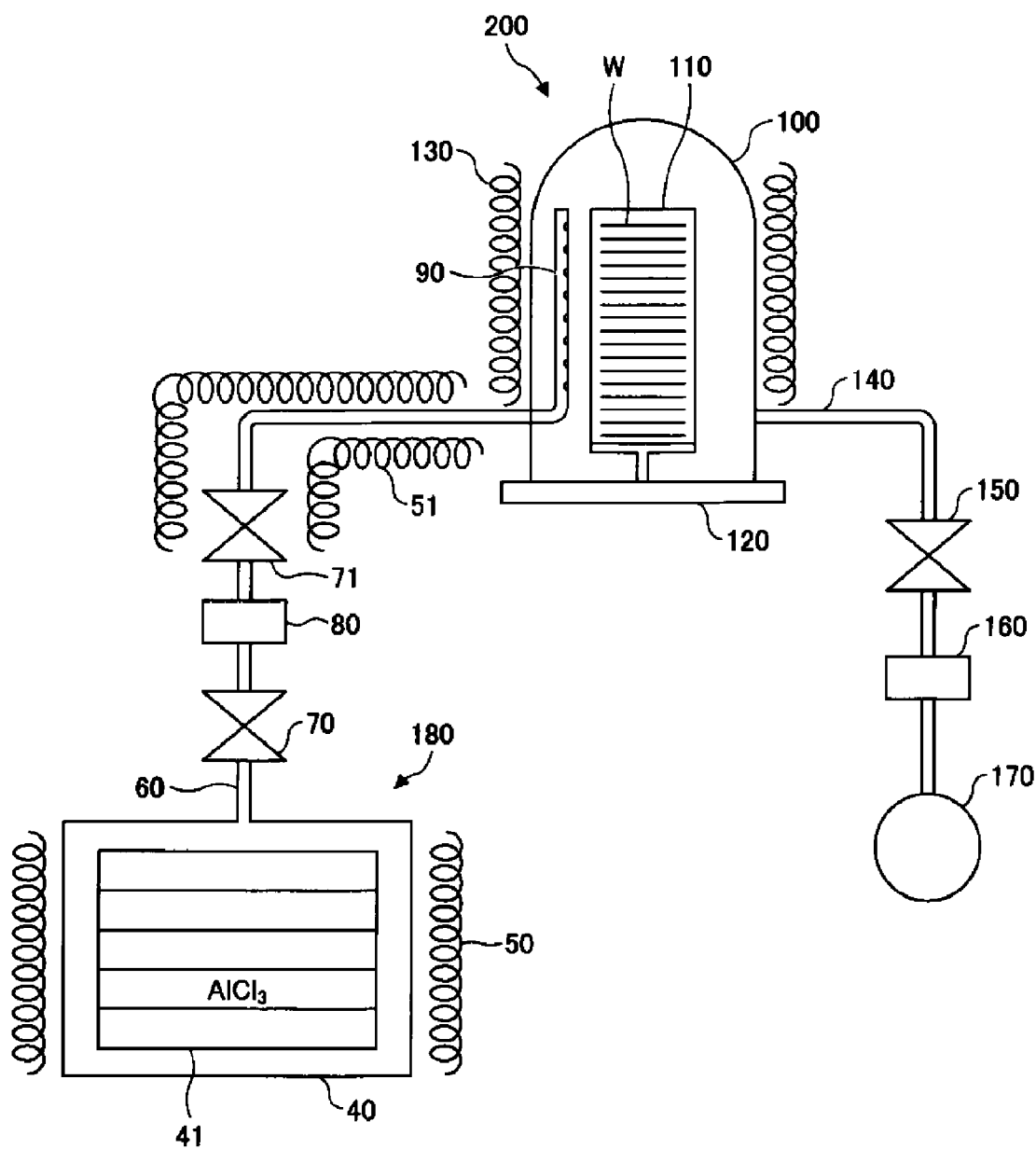
FIG. 1 is a view illustrating examples of a metal contamination prevention apparatus and a substrate processing apparatus according to an embodiment of the present disclosure.

FIG. 1 is a view illustrating examples of a metal contamination prevention apparatus 180 and a substrate processing apparatus 200 according to an embodiment of the present disclosure.

The metal contamination prevention apparatus 180 according to the present embodiment includes a metal chloride supply source 40, a heater 51, and a vacuum pump 170. In addition to the metal contamination prevention apparatus 180, the substrate processing apparatus 200 further includes a supply pipe 60, valves 70 and 71, a flow rate controller 80, an injector 90, a processing container 100, a wafer boat 110, a lid 120, a heater 130, an exhaust pipe 140, a valve 150, and a flow controller 160. The metal chloride supply source 40 may include a metal chloride storage container 41 and a heater 50 as needed.

The substrate processing apparatus 200 according to the present embodiment supplies, for example, a metal chloride gas, into the processing container 100 in which wafers W are accommodated, so as to perform a process of forming a film of a metal or a metal compound contained in the metal chloride gas on the wafer W. However, the substrate processing apparatus 200 according to the present embodiment is not limited to a film-forming apparatus, and may be configured as an etching apparatus. Even in the case of the film-forming apparatus, the substrate processing apparatus may be applied to various film-forming apparatuses such as an ALD-based film-forming apparatus, a CVD-based film-forming apparatus or the like.

The substrate processing apparatus 200 according to the present embodiment will be described with an example in which the substrate processing apparatus 200 is configured as a vertical heat treatment apparatus. In the vertical heat treatment apparatus, a plurality of wafers W are arranged in the wafer boat 110 at predetermined intervals in the vertical direction and the wafers W held by the wafer boat 110 are subjected to a heating treatment.

As illustrated in FIG. 1, in the substrate processing apparatus 200, the metal chloride supply source 40 is coupled to the injector 90 within the processing container 100 via the supply pipe 60, and the vacuum pump 170 is coupled to the processing container 100 via the exhaust pipe 140.

The metal chloride supply source 40 is a metal chloride storage part which is configured to gasify a metal chloride and supply the same to the processing container 100. Accordingly, the metal chloride supply source 40 is configured as a container capable of storing the metal chloride. The metal chloride supply source 40 may be made of various materials depending on the intended use. In one embodiment, a stainless steel on which an inactive film formed of a chromium oxide is formed may be used.

The metal chloride supply source 40 may include the metal chloride storage container 41 provided therein as needed. The metal chloride storage container 41 is a container that stores a metal chloride in the literature. The metal chloride storage container 41 may hold a metal chloride staying in a solid or liquid state at the room temperature. In this state, the metal chloride supply source 40 is heated by the heater 50 to vaporize the metal chloride. For example, in the case of using $AlCl_3$ as the metal chloride, since the $AlCl_3$ is a powdery solid, the $AlCl_3$ is required to be melt by heating and be further vaporized by evaporation so that the $AlCl_3$ is supplied to the injector 90. In such a case, the metal chloride storage container 41 may be provided.

The metal chloride storage container 41 may be configured in the form of a multiple-stage tray. When powder and the like are directly stored and heated in the metal chloride supply source 40 as a single large-sized container, heat transfer is good on the surface. However, heat is less likely to be transmitted to the powder existing near the bottom or center of the metal chloride supply source 40. This deteriorates heat transfer efficiency. Accordingly, the metal chloride storage container 41 may be provided within the metal chloride supply source 40 as needed.

In the case where the metal chloride to be supplied stays in a solid state or a liquid state, the heater 50 is a heating part for melting and evaporating the metal chloride so as to generate a metal chloride gas, and is provided as necessary. For example, the heater 50 is provided around the metal chloride supply source 40, or within the metal chloride supply source 40 and around the metal chloride storage container 41, and heats the metal chloride held in the metal chloride storage container 41. The heater 50 may have any configuration as long as the metal chloride can be heated at an appropriate temperature.

The supply pipe 60 is a supply path through which the metal chloride gas is supplied into the processing container 100. The supply pipe 60 is often made of a stainless steel (e.g., SUS316L). In the case of SUS316L, an inactive film made of chromium oxide ($CrO_3$) is formed on the surface of SUS316L from the viewpoint of corrosion prevention. The inactive film made of chromium oxide is very effective from the viewpoint of not corroding the supply pipe 60. However, if a chromium-oxygen bond is broken by chlorine, the surface of the stainless steel may be corroded. In such a case, when a substrate processing process such as film formation is performed, chromium may be mixed into the reaction gas. This causes metal contamination. Such metal contamination deteriorates quality and reliability of the substrate processing process.

Accordingly, in the metal contamination prevention apparatus 180 and the substrate processing apparatus 200 according to the present embodiment, the chromium component, which causes the metal contamination when reacting with chlorine, is removed from a passageway surface (inner peripheral surface) of the supply pipe 60. In addition, the passageway surface (inner peripheral surface) of the supply pipe 60 is covered with a metal compound contained in the metal chloride gas. Thus, in a case where surfaces of the valves 70 and 71, an inner surface of the metal chloride supply source 40, and the like, as well as the supply pipe 60, are formed of the stainless steel, a process of preventing the metal contamination can be performed similarly.

The valves 70 and 71 are opening/closing parts configured to open/close the supply path of the supply pipe 60. In many cases, inner surfaces of the valves 70 and 71 are also made of the stainless steel. Thus, the process of preventing the metal contamination can be performed by the metal contamination prevention apparatus 180 and the substrate processing apparatus 200 according to the present embodiment.

The heater 51 is provided to heat metal components such as the supply pipe 60 and the valves 70 and 71. In the metal contamination prevention method described later, it is necessary to vaporize chromium chloride (III) hexahydrate ($CrO_3.6H_2O$) in order to remove the chromium component. In a case where the vaporization of the chromium chloride (III) hexahydrate is performed by depressurization alone, the heater 51 may be omitted. However, in a case where the vaporization is performed by heating, the heater 51 for heating the metal components is required. Accordingly, the heater 51 may be provided at a position where the heater 51 is capable of heating the metal components such as the supply pipe 60 and the valves 70 and 71, for example, around the metal components, if necessary.

The flow rate controller 80 has a function of controlling a flow rate of the metal chloride gas supplied via the supply pipe 60. The flow rate controller 80 may use a mass flow controller.

The injector 90 is a gas supply part configured to supply the metal chloride gas into the processing container 100. As illustrated in FIG. 1, in the case where the substrate processing apparatus 200 is configured as a vertical heat treatment apparatus, the injector 90 extends in the vertical direction and has gas ejection holes formed to be arranged in the vertical direction. The injector 90 supplies the metal chloride gas toward the wafers W through the gas ejection holes.

In addition, injectors 90 may be provided corresponding to the types of gases to be supplied. In addition to the injectors 90 that supply the metal chloride gas, injectors 90 configured to supply other respective gases may be provided. Typically, a plurality of injectors 90 are provided. The injector 90 may be made of quartz.

The processing container 100 is a container configured to accommodate substrates such as the wafers W and to perform a substrate process such as the film formation process with respect to the substrates. In FIG. 1, since the substrate processing apparatus 200 is configured as a vertical heat treatment apparatus, the processing container 100 also has a vertically-elongated shape. The processing container 100 is made of, for example, quartz.

The wafer boat 110 is a wafer holder that holds the wafers W. In the case where the substrate processing apparatus 200 is configured as a vertical heat treatment apparatus, the wafer boat 110 is provided with 3 to 5 columns at positions along outer peripheries of the wafers W. A plurality of grooves are formed in inner sides of each column at regular intervals in the vertical direction so as to support the wafers W. That is to say, peripheral edges of the wafers W are placed in the respective grooves of each column, so that the wafers W are supported by the respective grooves. In FIG. 1, the configuration of the wafer boat 110 is schematically shown. The wafer boat 110 is made of, for example, quartz.

The vertical heat treatment apparatus is an example of the substrate processing apparatus 200. The substrate processing apparatus 200 may be configured as a single wafer type or semi-batch type film-forming apparatus in which one or more wafers W are placed on a circular susceptor. Even in such a film-forming apparatus, the stainless steel is often used for the supply pipe 60. Thus, the metal contamination prevention apparatus according to the present embodiment is suitably applicable.

The lid 120 is provided to support the wafer boat 110 and to open/close the processing container 100.

The heater 130 is provided to heat the wafers W accommodated in the processing container 100. The heater 130 is provided around the processing container 100. In general, since the film-forming process is performed at a high temperature, the heater 130 is provided to heat the wafers W when performing the film-forming process.

The exhaust pipe 140 is a pipe for exhausting the inside of the processing container 100, and functions as a flow path of an exhaust gas. The exhaust pipe 140 is also often formed of the stainless steel as in the supply pipe 60. It can be said that there is a little risk of metal contamination since a flow of the exhaust gas is not directed toward the processing container 100 but is oriented to be discharged from the processing container 100.

The valve 150 is provided to open/close the exhaust pipe 140 and to adjust a degree of opening/closing.

The flow rate controller 160 is provided to control an exhaust flow rate.

The vacuum pump 170 has a function of evacuating the inside of the processing container 100. Since the substrate process is usually performed in a vacuum, the vacuum pump 170 is provided to create a vacuum atmosphere inside the processing container 100. In addition, the metal contamination prevention apparatus 180 according to the present embodiment also plays a role of vaporizing a chromium-containing compound and further exhausting the vaporized compound. Details thereof will be described later.

Next, a metal contamination prevention method using the metal contamination prevention apparatus will be described.

FIGS. 2A to 2D are views for explaining an example of the metal contamination prevention method according to an embodiment of the present disclosure.

Figure 2A:
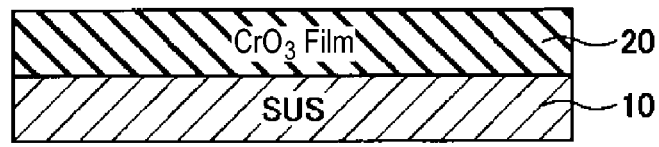
FIGS. 2A to 2D are views for explaining an example of the metal contamination prevention method according to an embodiment of the present disclosure.

FIG. 2A is a view illustrating an example of a cross section of the metal component made of stainless steel. For example, in FIG. 1, the inner surface of the metal chloride supply source 40, the inner peripheral surface of the supply pipe 60, the inner surfaces of the valves 70 and 71, and the like are often made of stainless steel.

As illustrated in FIG. 2A, an inactive film 20 made of chromium oxide ($CrO_3$) is formed on a front surface of a stainless steel 10. In the stainless-steel material, the covering of the inactive film 20 made of chromium-rich chromium oxide is capable of preventing corrosion of the stainless steel 10. However, if a chromium-oxygen bond is destroyed by chlorine, corrosion is likely to occur and thus rust is likely to occur. Then, the chromium component, the iron (Fe) component, the nickel (Ni) component and the like contained in the stainless steel 10 are mixed into the reaction gas. When such a mixed gas reaches the processing container 100, metal components such as chromium, iron, nickel and the like may be mixed in the substrate process. This deteriorates the quality of the substrate process. Therefore, when performing the substrate process, it is desirable to remove the chromium component of the inactive film 20 such that the chromium component is not mixed with the reaction gas or the like.

In FIGS. 2A to 2D, for the sake of easier understanding, an example in which the supply pipe 60 is made of stainless steel and an aluminum chloride gas ($AlCl_3$) is supplied from the metal chloride supply source 40 will be described.

Figure 2B:
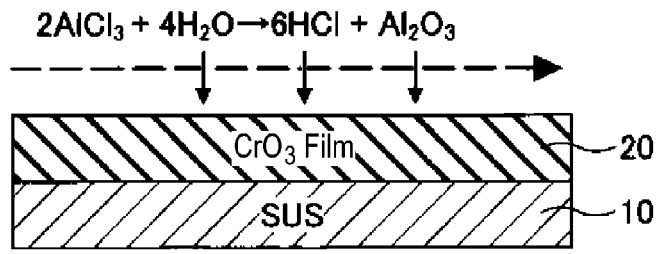

FIG. 2B is a view illustrating a state in which the aluminum chloride gas is flowing through the supply pipe 60. When the aluminum chloride gas is flowing through the supply pipe 60, the aluminum chloride gas reacts with water to generate hydrochloric acid (HCl) and to generate aluminum oxide ($Al_2O_3$) as well. That is to say, a chemical reaction as represented in the following Equation (1) occurs.

$$2AlCl_3 + 4H_2O \rightarrow 6HCl + Al_2O_3 \qquad (1)$$

Here, the water is sufficient with moisture existing on the surface of the supply pipe 60 or in the air. Thus, when $AlCl_3$ is supplied, the naturally-existing water and the aluminum chloride react with each other so that the reaction of the above Equation (1) occurs. Due to the occurrence of the reaction of Equation (1), hydrochloric acid and aluminum oxide are generated.

The aluminum chloride is essentially a granular solid. Thus, the aluminum chloride is vaporized and used by heating the metal chloride supply source 40 with the heater 50. At that time, the metal chloride supply source 40 may be heated using the heater 50 in the state in which the aluminum chloride staying in the solid state is stored in the metal chloride storage container 41.

In the step of FIG. 2B, the reaction of Equation (1) occurs to generate a hydrochloric acid. The hydrochloric acid is supplied into the supply pipe 60. In this regard, the step of FIG. 2B will be referred to as a hydrochloric acid supply step or a hydrochloric acid generation step. In addition, since an aluminum oxide used to cover the inactive film 20 is also generated, the step of FIG. 2B will be referred to as an aluminum oxide generation step.

Figure 2C:
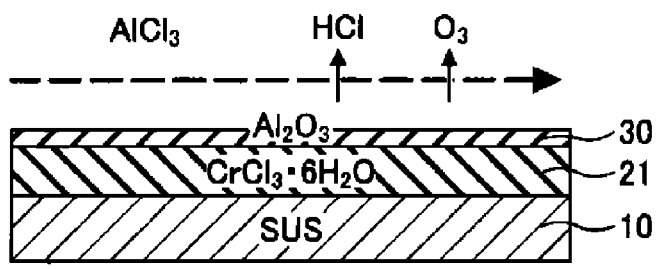

FIG. 2C illustrates an example of a chromium chloride (III) hexahydrate formation step. The hydrochloric acid (HCl), the aluminum oxide ($Al_2O_3$), and the water ($H_2O$) are supplied to the inactive film 20 in the hydrochloric acid supply step described with reference to FIG. 2B. Here, the hydrochloric acid and the aluminum oxide are compounds generated by the reaction of Equation (1). As described above, the water is moisture existing on the surface of the inactive film 20, in the air, or contained in the inactive film 20 and the stainless steel 10.

By supplying the hydrochloric acid and the water to the inactive film 20 containing the chromium oxide ($CrO_3$), a reaction represented by the following Equation (2) occurs.

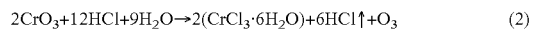

$$2CrO_3 + 12HCl + 9H_2O \rightarrow 2(CrCl_3 \cdot 6H_2O) + 6HCl\uparrow + O_3 \qquad (2)$$

By this reaction, $CrO_3$ constituting the inactive film 20 is changed into and replaced by $CrCl_3.6H_2O$ (chromium chloride (III) hexahydrate) 21. In addition, the aluminum oxide ($Al_2O_3$) 30 generated by the reaction of Equation (1) is deposited on the inactive film 20.

Accordingly, as illustrated in FIG. 2C, the chromium chloride (III) hexahydrate 21 is deposited on the stainless steel 10, and the aluminum oxide 30 is deposited on the chromium chloride (III) hexahydrate 21.

In FIG. 2C, for the sake of easier understanding, there is shown the state in which the chromium chloride (III) hexahydrate 21 is deposited in a layer shape on the front surface of the stainless steel 10 and the aluminum oxide 30 is further deposited on the chromium chloride (III) hexahydrate 21. However, since the reactions of Equations (1) and (2) occur almost simultaneously, in practice, the chromium chloride (III) hexahydrate 21 and the aluminum oxide 30 remains mixed with each other. At that time, $Al_2O_4$ as well as $Al_3O_3$ are generated at a boundary between the chromium chloride (III) hexahydrate 21 and the aluminum oxide 30.

As described above, FIG. 2C illustrates the step of generating the chromium chloride (III) hexahydrate 21. In this regard, the step of FIG. 2C may be referred to as a chromium chloride (III) hydrate generation step. The step of FIG. 2C is also a step of covering the front surface of the inactive film 20 with the aluminum oxide (a metal compound, more specifically, a metal oxide). In this regard, the step of FIG. 2C may be referred to as a metal-compound covering step or a metal oxide covering step.

Figure 2D:
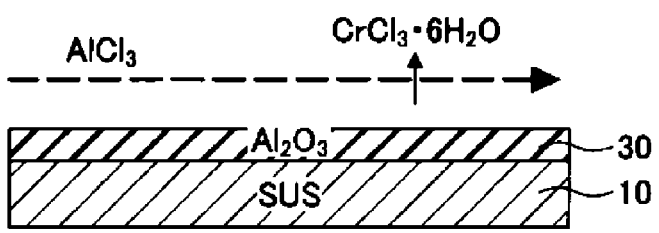

FIG. 2D illustrates an example of a chromium removal step. In the chromium removal step, the chromium chloride (III) hexahydrate 21 deposited on the front surface of the stainless steel 10 is removed by vaporization.

The $CrCl_3.6H_2O$ (chromium chloride (III) hexahydrate) has a melting point of 83 degrees C. Thus, the $CrCl_3.6H_2O$ can be evaporated and removed by depressurizing and/or heating the inside of the supply pipe 60. Only one of the depressurization or the heating may be performed as long as it is possible to remove $CrCl_3.6H_2O$. Alternatively, the depressurization and the heating may be performed simultaneously. Accordingly, in a case where the removal of $CrCl_3.6H_2O$ is difficult by only one of the depressurization and the heating, a procedure of performing both the depressurization and the heating may be applied for the removal. Whether to perform any of the depressurization and the heating, and a degree of the depressurization and the heating may be set in various combinations depending on the intended use as long as it is possible to evaporate and remove the chromium chloride (III) hexahydrate.

By the above reactions, the chromium component contained in the inactive film 20 is removed.

The depressurization may be performed using the vacuum pump 170, and the heating may be performed using the heater 51 provided around the metal components such as the supply pipe 60 and the like. However, if the chromium chloride (III) hexahydrate in the supply pipe 60 can be evaporated using the heaters 50 and 130 and/or the vacuum pump 170, the heater 51 dedicated to the metal components may be omitted.

Simultaneously with the removal of the chromium component from the inactive film 20, the deposition of the aluminum oxide ($Al_2O_3$) produced by the reaction of Equation (1) on the inactive film 20 is also continued. Thus, although one covered on the front surface of the stainless steel 10 was initially the inactive film 20 containing chromium oxide, the inactive film 20 is subsequently replaced with the aluminum oxide 30. As a result, as illustrated in FIG. 2D, the front surface of the stainless steel 10 is covered with the aluminum oxide 30.

In this state, when the aluminum chloride gas is supplied toward the processing container 100, the supply pipe 60 is covered with oxide of aluminum contained in the aluminum chloride gas. Thus, it is possible to perform high-purity and high-quality substrate process without preventing the chromium component as a foreign substance from being mixed into the aluminum chloride gas.

Although in FIG. 2D, the inactive film 20 have been shown to be replaced by the aluminum oxide 30 for the sake of easier understanding, a small amount of the inactive film 20 may remain without being completely removed. Even in this case, since the front surface of the remaining inactive film 20 is covered with the aluminum oxide 30, there is no problem with regard to the flowing of the aluminum chloride gas.

The metal contamination prevention method illustrated with reference to FIGS. 2A to 2D is continuously performed as long as moisture exists in the supply pipe 60. If moisture to be used in the reaction disappears, the method is terminated. That is to say, water is required to cause not only the reaction of Equation (1) which generates the hydrochloric acid and the aluminum oxide but also the reaction of Equation (2) which generates the chromium chloride (III) hexahydrate.

A concentration of the water may be set to fall within a range of 1 ppb to 2.5%, specifically a range of 1 ppb to 30 ppm, more specifically a range of 1 ppb to 0.5 ppm. In this way, the reactions of Equations (1) and (2) may occur with a small amount of moisture. Thus, it is possible to cause the reactions of Equations (1) and (2) to occur sufficiently with naturally-existing moisture even if water is not intentionally supplied.

On the contrary, after the water present around the metal components is consumed, it is possible to stop the reactions of Equations (1) and (2) as along as water is additionally supplied. In this manner, the execution and interruption of the metal contamination prevention method according to the present embodiment may be controlled with water.

As described above, according to the metal contamination prevention method according to the present embodiment, it is possible to prevent metal contamination by supplying the metal chloride gas, which is to be supplied in the substrate process, to the metal components such as the supply pipe 60 covered with the inactive film 20 containing chromium oxide, and by setting the surrounding atmosphere of the metal components to a pressure environment and/or a temperature environment in which the chromium chloride (III) hexahydrate can be evaporized. In particular, the ability of covering the metal components with metal compounds including the metal chloride gas to be supplied in the substrate process is very effective. Thus, even if some chromium component remains on the front surfaces of the metal components, it is possible to prevent the chromium component from diffusing into the supply pipe 60 by the covering of the metal compounds with the metal compounds. By simultaneously performing the removal of the chromium component and the covering of the metal components, it is possible to reliably prevent metal contamination.

The metal contamination prevention method described with reference to FIGS. 2A to 2D may be performed before performing the substrate process. That is to say, by performing the metal contamination prevention method according to the present embodiment in a state where the wafer boat 110 on which the wafers W are mounted is not loaded into the processing container 100, or only the wafer boat 110 on which no wafers W are mounted is loaded into the processing container 100, it is possible to operate the substrate processing apparatus 200 in the state in which metal contamination does not occur. Thus, by performing the substrate process in this state, it is possible to implement high-quality substrate process.

By performing the metal contamination prevention method according to the present embodiment for causing the reactions of Equations (1) and (2), for example, for about one hour, it is possible to achieve a sufficient effect. Therefore, the throughput of the substrate process is not significantly reduced.

In a case where there are a plurality of injectors 90 and a plurality of supply pipes 60 for supplying the metal chloride gas, the metal contamination prevention method may be executed for each of the injectors 90 and the supply pipes 60 using the metal contamination prevention apparatus 180 according to the present embodiment. The metal contamination prevention method and the metal contamination prevention apparatus 180 according to the present embodiment are suitably applicable even when the types of metal chloride gases are different.

Examples of the metal chloride to which the metal contamination prevention apparatus 180 and the metal contamination prevention method according to the present embodiment may include a solid metal chloride such as $WCl_5$, $WCl_6$, $HfCl_4$, $TaCl_5$, $ZrCl_4$, $MoCl_5$, $AgCl$, $GaCl_3$, $PdCl_2$, $MgCl_2.6H_2O$, $InCl_3$, $4H_2O$, $NiCl_2.6H_2O$, $CuCl_2.2H_2O$, $CoCl_2.6H_2O$, $CrCl_3.6H_2O$, $SnCl_2.6H_2O$, $RhCl_3.3H_2O$, $RuCl_3.xH_2O$, $WOCl_4$, $NbCl_5$, $InCl_3$ or the like, other than $AlCl_3$ mentioned in above the embodiment. These chlorides remain in a solid state at room temperature. Thus, like the aluminum chloride, the solid metal chloride is required to be gasified by being heated and evaporated through the heater 50 in the state of being accommodated in the metal chloride supply source 40. As needed, the solid metal chloride may be stored in the metal chloride storage container 41 and may be heated and evaporated by the heater 50.

Examples of the liquid metal chloride may include $SnCl_4$ and $TiCl_4$. Even when the metal chloride remains in a liquid state, the liquid metal chloride is required to be gasified. Thus, the heater 50 gasifies the liquid metal chloride to form a metal chloride gas. In this case, the metal chloride storage container 41 suitable for the gasification of the liquid metal chloride may be used as needed so as to efficiently generate the metal chloride gas.

Examples of a gaseous metal chloride may include $SiH_2Cl_2$, $POCl_3$, $SiHCl_3$, $Si_2Cl_6$, $CH_2Cl_2$, $TiCl_4$, $SiCl_4$, $Si_3Cl_8$ and the like. Since the gaseous metal chlorides originally exist as metal chloride gases, they may be stored in the metal chloride supply source 40 and may be supplied into the supply pipe 60 using the valves 70 and 71. In this case, the heater 50 may be omitted and the metal chloride storage container 41 may be also omitted.

As described above, the metal contamination prevention apparatus 180 and the substrate processing apparatus 200 according to the present embodiment, and the metal contamination prevention method and the substrate processing method using these apparatuses are applicable to various metal chloride gases, and are capable of preventing metal contamination and enhancing the quality of substrate process for such metal chloride gases.

As described above, in the case of applying the metal contamination prevention apparatus 180 and the metal contamination prevention method to the substrate processing apparatus 200 and the substrate processing method, it is preferable to perform the metal contamination prevention method illustrated with reference to FIGS. 2A to 2D before initiating a procedure of the substrate process. This make it possible to perform the substrate process in the state in which metal contamination does not occur, thus preventing the occurrence of defective products due to metal contamination in a reliable manner.

Figure 3:
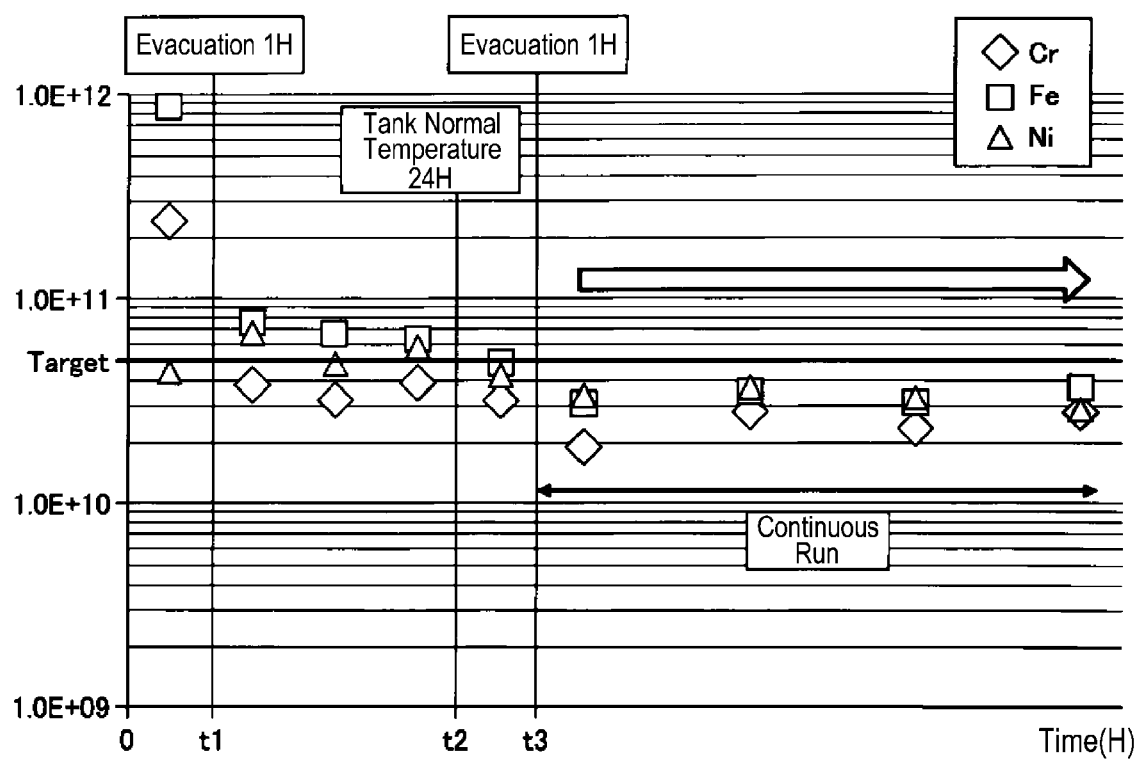
FIG. 3 is a view for explaining an Example to which the metal contamination prevention method according to the present embodiment has been applied.

FIG. 3 is a view for explaining an example in which the metal contamination prevention method according to the present embodiment is performed. In FIG. 3, the horizontal axis represents time (H), and the vertical axis represents detected amounts of metal elements. In this example, film formation was performed using the substrate processing apparatus 200 illustrated with reference to FIG. 1. How much of components of Cr, Fe, and Ni were contained in deposited thin films was examined.

Aluminum chloride gas was generated by heating the metal chloride supply source 40 to 120 degrees C. for 18 seconds with the heater 50, and was supplied to wafers in the state in which a flow rate of Ar as a carrier gas was set to 500 sccm.

In FIG. 3, a period of time between time 0 and time t1 is one hour. Evacuation was performed for one hour using the vacuum pump 170 under room temperature condition. Detected amounts of Cr and Fe at time t1 were decreased. Thereafter, a film formation test for confirming metal contamination was performed three times from time t1 to time t2.

At time t2, the heating of the metal chloride supply source 40 was stopped. After 24 hours, the metal chloride supply source 40 was heated again to generate an aluminum chloride gas. The temperature was further increased. The metal contamination prevention method according to the present embodiment was performed. Thereafter, evacuation was performed again, and the film formation was continuously performed from time t3.

As a result, at time t3, the detected amounts of all of Cr, Fe, and Ni were decreased. Thereafter, although the film-forming process was continued, the detected amounts of all of Cr, Fe and Ni were increased very little.

Therefore, this example shows that it is possible to prevent metal contamination and to perform a high-quality substrate process by implementing the metal contamination prevention method using the metal contamination prevention apparatus 180 according to the present embodiment and implementing the substrate processing method using the substrate processing apparatus 200 according to the present embodiment.

Figure 4:
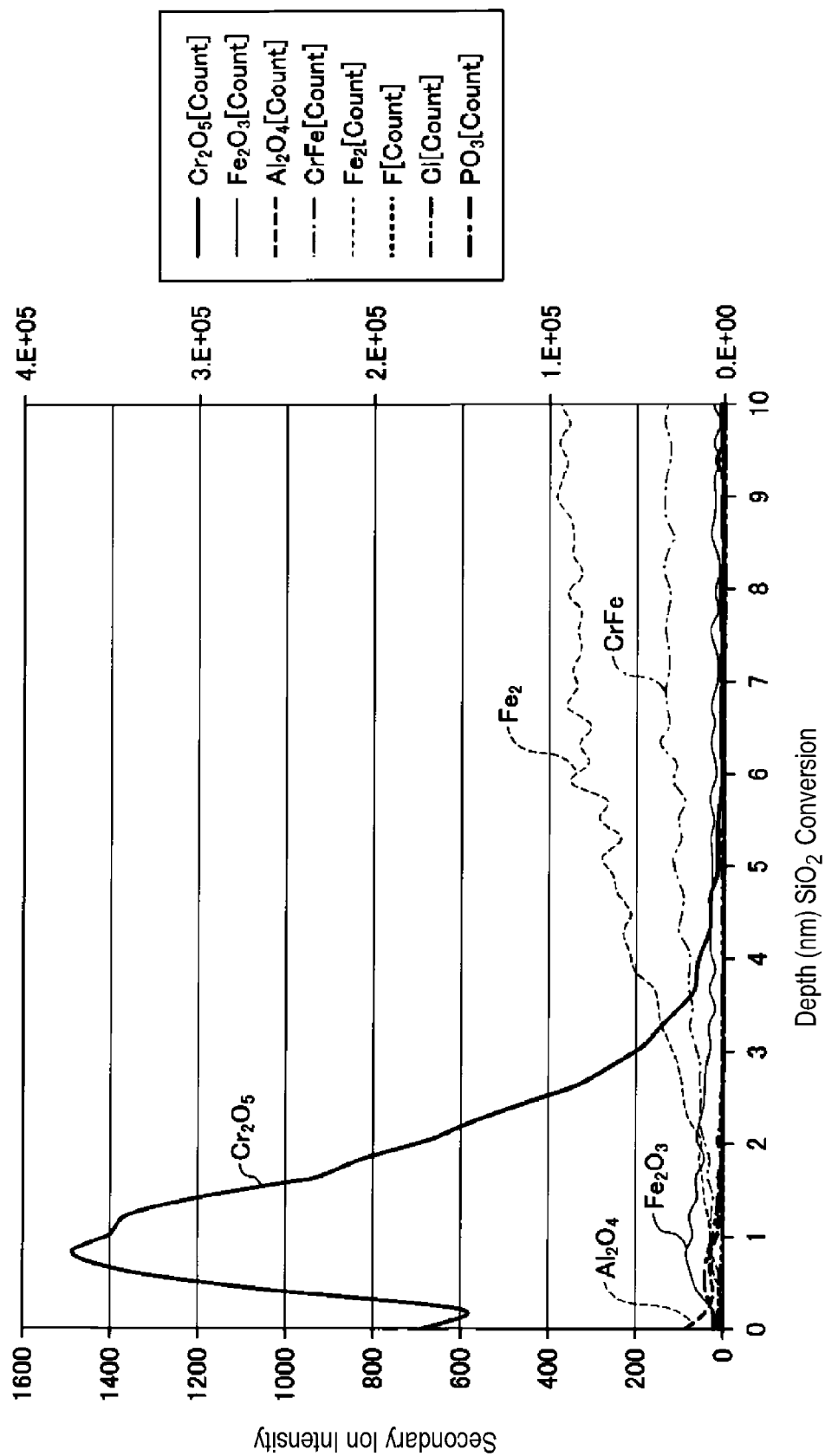
FIG. 4 is a diagram showing the result obtained by measuring metal components in the depth direction of a supply pipe in a case where the metal contamination prevention method according to the present embodiment was not applied.

FIG. 4 is a diagram representing the results obtained by measuring metal components in the depth direction of the supply pipe 60 containing stainless steel before performing the metal contamination prevention method according to the present embodiment. The metal components were measured using a time-of-flight secondary ion mass spectrometer (product name: ToF-SIMS, manufactured by ION-TOF) with Bi as a primary ion source and Cs as a sputtering ion source. The vertical axis represents a secondary ion intensity used as an index indicating a metal component content. The horizontal axis represents a depth (nm) from a surface (inner peripheral surface) of the metal component to be measured.

As represented in FIG. 4, the content of chromium oxide ($Cr_2O_5$) at a depth of 1 nm from the surface (inner peripheral surface) was as very large as about 1,500. In addition, the content of the aluminum oxide ($Al_2O_4$) at a depth of 1 nm or less was as very small as 100 or less.

Figure 5:
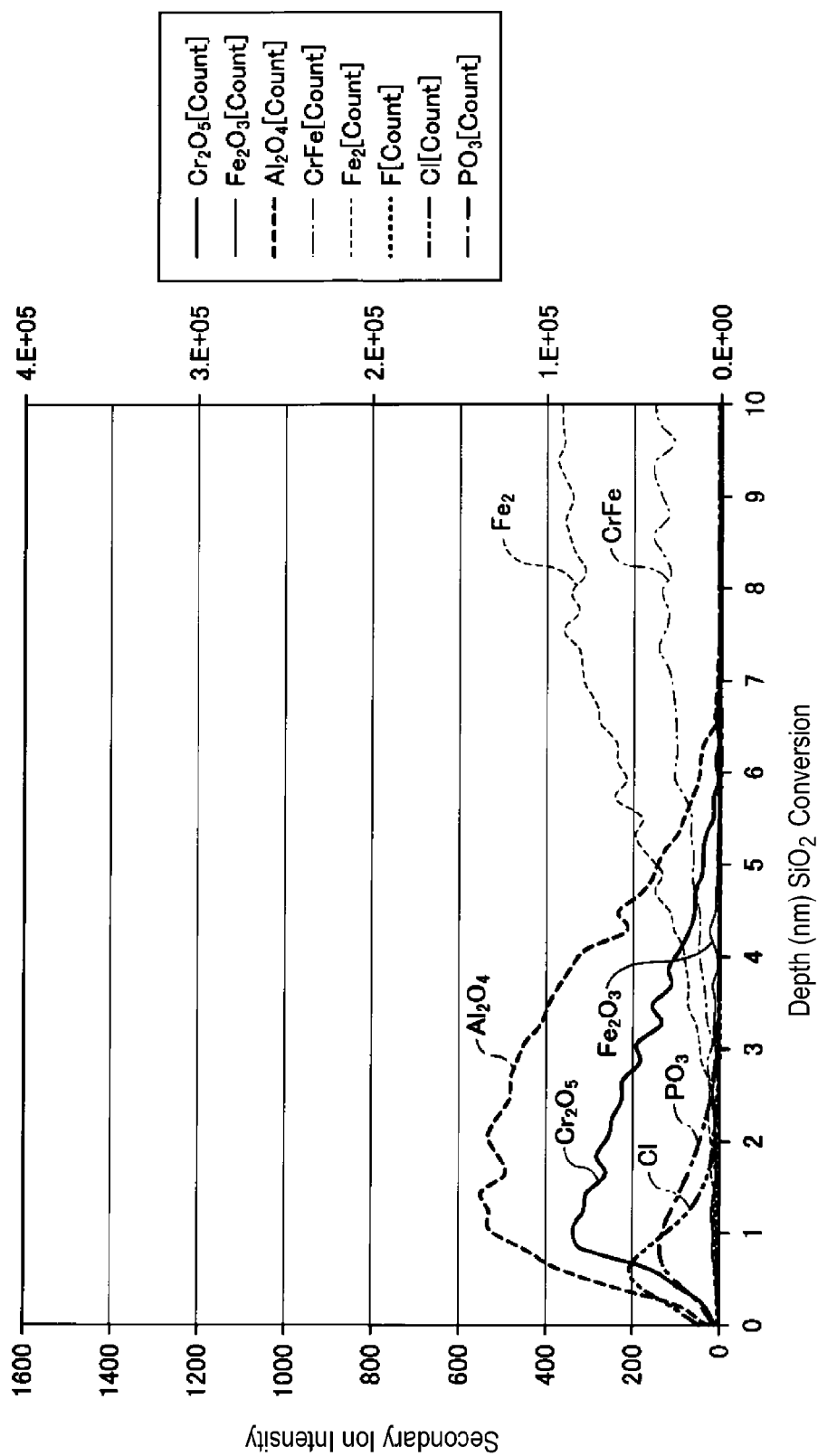
FIG. 5 is a diagram showing the result obtained by measuring metal components in the depth direction of a supply pipe in a case where the metal contamination prevention method according to the present embodiment was applied.

FIG. 5 is a diagram representing the results obtained by measuring metal components in the depth direction of the supply pipe 60 containing stainless steel after performing the metal contamination prevention method according to the present embodiment.

In FIG. 5, the content of the chromium oxide ($Cr_2O_5$) at a depth of 1 nm or less was greatly reduced to a level of less than 350. In addition, the content of the aluminum oxide ($Al_2O_4$) was increased. At any depth from 0 to 6.5 nm, the content of the aluminum oxide exceeded the content of the chromium oxide. In particular, at a depth of 1 to 2 nm as a peak value, the content of the aluminum oxide reached 550. It is believed that the aluminum oxide is capable of almost completely covering the chromium oxide.

Figure 6:
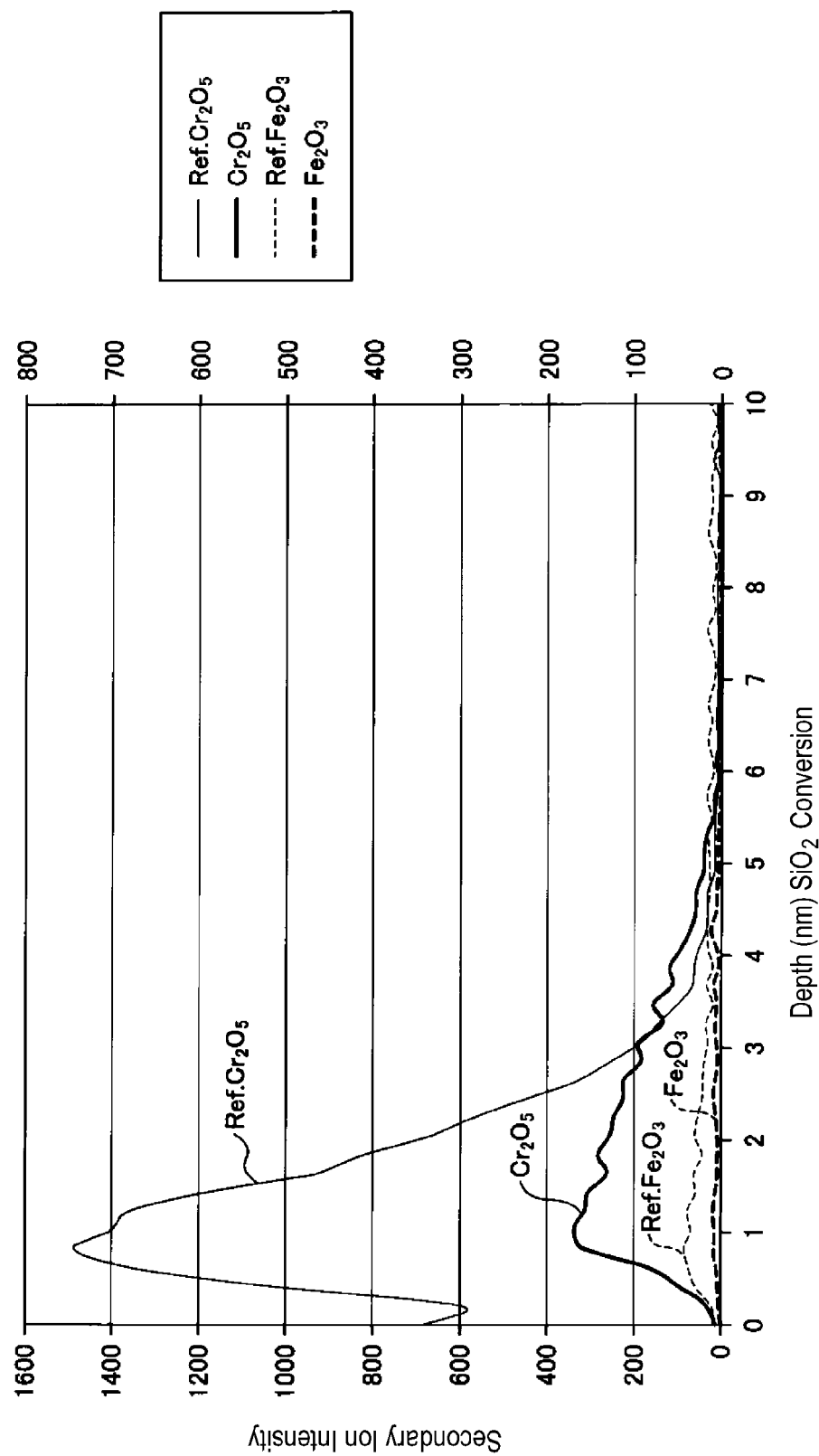
FIG. 6 is a diagram representing intensities of secondary ions of $Cr_2O_5$ and $Fe_2O_3$, which are taken from FIGS. 4 and 5.

FIG. 6 is a diagram representing secondary ion intensities of $Cr_2O_5$ and $Fe_2O_3$ taken from FIGS. 4 and 5, which shows changes in secondary ion intensity of $Cr_2O_5$ and $Fe_2O_3$ before and after performing the metal contamination prevention method according to this example. As shown in FIG. 6, it can be seen that at a depth of 1 nm, the secondary ion intensity of $Cr_2O_5$ was decreased from about 1,500 to about 350, and the secondary ion intensity $Fe_2O_3$ was decreased from about 70 to a level of about 10 or less. Therefore, it has been found that, by performing the metal contamination prevention method according to this example, the surface of the metal component was modified, which contributes to reduce the metal contamination.

It has been found that, according to the metal contamination prevention method according to this example, it is possible to reduce the content of the chromium oxide and to almost completely cover the surface of the metal component with the aluminum oxide, thus preventing metal contamination even when the metal chloride is used.

According to the present disclosure, it is possible to prevent metal contamination caused by chromium.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A metal contamination prevention method performed by passing a metal chloride gas through a metal component having a surface covered with an inactive film formed of a chromium oxide, the method comprising:
   generating a chromium chloride (III) hexahydrate by supplying a hydrochloric acid to the inactive film covering the surface of the metal component and allowing the chromium oxide to react with the hydrochloric acid;
   removing a chromium from the inactive film by evaporating the chromium chloride (III) hexahydrate; and
   covering a surface of the inactive film with a compound containing a metal contained in the metal chloride gas.

2. The metal contamination prevention method of claim 1, wherein a depth at which the chromium is removed from the inactive film is at least 1 nm, and
   a thickness with which the surface of the inactive film is covered with the compound is at least 2 nm.

3. The metal contamination prevention method of claim 1, wherein the compound containing the metal contained in the metal chloride gas is an oxide of the metal contained in the metal chloride gas.

4. The metal contamination prevention method of claim 3, wherein the hydrochloric acid is generated by allowing the metal chloride gas to react with a water.

5. The metal contamination prevention method of claim 4, wherein the oxide of the metal contained in the metal chloride gas is generated together with the hydrochloric acid by allowing the metal chloride gas to react with the water, and
   wherein the generating the chromium chloride (III) hexahydrate and the covering the surface of the inactive film are simultaneously performed.

6. The metal contamination prevention method of claim 4, wherein the water is a moisture contained in an air, or inherently adhering to the metal component.

7. The metal contamination prevention method of claim 4, wherein a concentration of the water is set to fall within a range of 1 ppb to 2.5%.

8. The metal contamination prevention method of claim 1, wherein the removing the chromium from the inactive film comprises depressurizing an atmosphere around the metal component.

9. The metal contamination prevention method of claim 1, wherein the removing the chromium from the inactive film comprises heating an atmosphere around the metal component.

10. The metal contamination prevention method of claim 1, wherein the metal component is a pipe, and
    the surface of the metal component is an inner peripheral surface of the pipe.

11. The metal contamination prevention method of claim 10, wherein the pipe contains a stainless steel.

12. The metal contamination prevention method of claim 10, wherein the pipe is a pipe configured to supply the metal chloride gas therethrough.

13. The metal contamination prevention method of claim 1, wherein the metal chloride gas is one selected from the group of a gas obtained by evaporating $AlCl_3$, $WCl_5$, $WCl_6$, $HfCl_4$, $TaCl_5$, $ZrCl_4$, $MoCl_5$, $AgCl$, $GaCl_3$, $PdCl_2$, $MgCl_2 \cdot 6H_2O$, $InCl_3 \cdot 4H_2O$, $NiCl_2 \cdot 6H_2O$, $CuCl_2 \cdot 2H_2O$, $CoCl_2 \cdot 6H_2O$, $CrCl_3 \cdot 6H_2O$, $SnCl_2 \cdot 6H_2O$, $RhCl_3 \cdot 3H_2O$, $RuCl_3 \cdot xH_2O$, $WOCl_4$, $NbCl_5$, or $InCl_3$, which remains in a solid state, a gas obtained by evaporating $SnCl_4$ or $TiCl_4$, which remains in a liquid state, and $SiH_2Cl_2$, $POCl_3$, $SiHCl_3$, $Si_2Cl_6$, $CH_2Cl_2$, $TiCl_4$, $SiCl_4$, $Si_3Cl_8$, which remains in an inherent gas state.

14. A substrate processing method using a metal contamination prevention method,
    wherein the metal contamination prevention method includes: passing a metal chloride gas through a metal component having a surface covered with an inactive film formed of a chromium oxide: generating a chromium chloride (III) hexahydrate by supplying a hydrochloric acid to the inactive film covering the surface of the metal component and allowing the chromium oxide to react with the hydrochloric acid; removing a chromium from the inactive film by evaporating the chromium chloride (III) hexahydrate; and covering a surface of the inactive film with a compound containing a metal contained in the metal chloride gas,
    wherein the metal component is a pipe connected to a processing chamber of a substrate processing apparatus,
    the substrate processing method comprises:

performing the metal contamination prevention method; and subsequently, performing a substrate process by supplying a processing gas into the processing chamber from the pipe.

* * * * *